United States Patent
Cheng et al.

(10) Patent No.: US 9,837,407 B1
(45) Date of Patent: Dec. 5, 2017

(54) SEMICONDUCTOR DEVICE WITH INCREASED SOURCE/DRAIN AREA

(71) Applicant: INTERNATIONAL BUSINESS MACHINES CORPORATION, Armonk, NY (US)

(72) Inventors: Kangguo Cheng, Schenectady, NY (US); Chi-chun Liu, Altamont, NY (US); Peng Xu, Guilderland, NY (US); Jie Yang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/257,232

(22) Filed: Sep. 6, 2016

(51) Int. Cl.
*H01L 27/088* (2006.01)
*H01L 29/06* (2006.01)
*H01L 21/8234* (2006.01)

(52) U.S. Cl.
CPC .. *H01L 27/0886* (2013.01); *H01L 21/823431* (2013.01); *H01L 21/823481* (2013.01); *H01L 29/0676* (2013.01); *H01L 2924/0645* (2013.01); *H01L 2924/13067* (2013.01)

(58) Field of Classification Search
CPC ... H01L 2924/0645; H01L 2924/13067; H01L 21/823431; H01L 21/823821; H01L 21/823481; H01L 27/0886; H01L 27/0924; H01L 27/10879; H01L 29/41791; H01L 29/66795; H01L 29/7831; H01L 29/785
See application file for complete search history.

(56) References Cited

U.S. PATENT DOCUMENTS

| | | | |
|---|---|---|---|
| 6,329,225 B1 | 12/2001 | Rodder | |
| 8,324,058 B2 | 12/2012 | Cheng et al. | |
| 8,877,604 B2 | 11/2014 | Adam et al. | |
| 8,921,191 B2 | 12/2014 | Cai et al. | |
| 9,123,632 B2 | 9/2015 | Yamazaki et al. | |
| 9,196,613 B2 | 11/2015 | Basker et al. | |
| 9,230,820 B2 * | 1/2016 | Ruiz | H01L 21/3086 |
| 9,536,739 B2 * | 1/2017 | Leobandung | H01L 29/785 |
| 2012/0112279 A1 | 5/2012 | Cheng et al. | |
| 2012/0306015 A1 | 12/2012 | Cheng et al. | |
| 2014/0167164 A1 | 6/2014 | Adam et al. | |
| 2015/0060944 A1 | 3/2015 | Adam et al. | |
| 2015/0076108 A1 * | 3/2015 | Chang | G03F 7/40 216/49 |
| 2016/0027685 A1 * | 1/2016 | Civay | H01L 21/76802 438/674 |
| 2016/0099342 A1 | 4/2016 | Basker et al. | |

FOREIGN PATENT DOCUMENTS

| | | |
|---|---|---|
| CN | 2726125 Y | 8/2004 |
| JP | 3394914 B2 | 3/2000 |
| WO | 2015045288 A1 | 4/2015 |

* cited by examiner

*Primary Examiner* — Cheung Lee
*Assistant Examiner* — Stephen C Smith
(74) *Attorney, Agent, or Firm* — Cantor Colburn LLP; Vazken Alexanian

(57) ABSTRACT

A semiconductor device includes a semiconductor fin arranged on a substrate, a gate stack arranged over a channel region of the fin, and a spacer arranged adjacent to the gate stack. A source/drain region is arranged in the fin the source/drain region having a cavity that exposes a portion of the semiconductor fin. An insulator layer is arranged over a portion of the fin, and a conductive contact material is arranged in the cavity and over portions of the source/drain region.

18 Claims, 32 Drawing Sheets

SEMICONDUCTOR DEVICE WITH INCREASED SOURCE/DRAIN AREA

BACKGROUND

The present invention generally relates to complimentary metal-oxide semiconductors (CMOS) and metal-oxide-semiconductor field-effect transistors (MOSFET), and more specifically, to finFET technology.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

As CMOS scales to smaller dimensions, nanowire devices provide advantages. A nanowire is often suspended above the substrate by source/drain regions or the gate stack. Since the nanowire is suspended, the channel region of a nanowire device has 360 degrees of exposed area. The gate stack can be formed around the channel region of the nanowire to form a gate-all-around-device. The nanowire can provide even more surface area and greater channel length than a finFET device or planar FET device in a given region of a substrate. Nanowire FETs can be formed from stacked nanowires providing even greater layout density. Stacked nanowires provide, for example, increased drive current within a given layout area.

Gate spacers form an insulating film along gate sidewalls. Gate spacers can also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for fabricating a semiconductor device includes forming a semiconductor fin on a substrate, and forming a sacrificial gate on a channel region of the fin. A co-polymer layer is formed on the fin adjacent to the sacrificial gate. Annealing is performed to form a first block, a second block, and a third block from the co-polymer layer on the fin, the second block arranged between the first block and the third block. The first block and the third block are removed to expose portions of the fin. Exposed portions of the fin are removed to form a first cavity and a second cavity in the fin. The second block is removed to expose a portion of the fin. A source/drain region is grown in the first cavity and the second cavity and a region of the fin arranged between the source/drain region in the first cavity and the second cavity to form a third cavity is removed. An insulator layer is deposited over the source/drain region and the third cavity. The sacrificial gate is removed and a gate stack is formed over a channel region of the fin. Portions of the insulator layer are removed to form a fourth cavity that exposes the source/drain region and the third cavity, and the fourth cavity and the exposed third cavity are filled with a conductive contact material.

According to another embodiment of the present invention, a method for fabricating a semiconductor device includes forming a semiconductor fin on a substrate, and forming a sacrificial gate on a channel region of the fin. Portions of the fin are removed to form a first cavity adjacent to the sacrificial gate. A source/drain region is grown in the first cavity. A co-polymer layer is formed on the source/drain region adjacent to the sacrificial gate. An annealing process is performed to form a first block, a second block, and a third block from the co-polymer layer on the source/drain region, the second block arranged between the first block and the third block. The second block is removed to expose a portion of the source/drain region. Exposed portions of the source/drain region are removed to form a second cavity in the source/drain region. An insulator layer is deposited over the source/drain region and the second cavity. The sacrificial gate is removed, and a gate stack is formed over a channel region of the fin. Portions of the insulator layer are removed to form a third cavity that exposes the source/drain region and the second cavity, and the third cavity and the exposed second cavity are filled with a conductive contact material.

According to yet another embodiment of the present invention, A semiconductor device includes a semiconductor fin arranged on a substrate, a gate stack arranged over a channel region of the fin, and a spacer arranged adjacent to the gate stack. A source/drain region is arranged in the fin the source/drain region having a cavity that exposes a portion of the semiconductor fin. An insulator layer is arranged over a portion of the fin, and a conductive contact material is arranged in the cavity and over portions of the source/drain region.

BRIEF DESCRIPTION OF THE DRAWINGS

FIGS. 1-17 illustrate an exemplary method for forming a finFET with a source/drain region having increased contact area.

FIG. 1 illustrates a side view of a wafer 101 that includes a bulk semiconductor substrate and a hardmask layer arranged on the semiconductor substrate.

FIG. 3 illustrates a cut-away view following the deposition of a semiconductor trench isolation region adjacent to the fin and on the substrate.

FIG. 6 illustrates a cut-away view following the deposition of a directed self-assembly co-polymer material over the fin and between the spacers of the sacrificial gates.

FIG. 7 illustrates a cut-away view following an annealing process that results in the co-polymer material arranging into blocks.

FIG. 8 illustrates a cut-away view following a selective etching process that removes the blocks (of FIG. 7) and exposes portions of the fin.

FIG. 9 illustrates a cut-away view following a selective anisotropic etching process that removes exposed portions of the fin to form cavities (first cavities and second cavities) adjacent to the spacers.

FIG. 10 illustrates a cut-away view following the removal of the block (of FIG. 9) and the formation of source/drain regions in the cavities (of FIG. 9).

FIG. 11 illustrates a cut-away view following a selective etching process that removes material from the fin between the source/drain regions to form a cavity between the source/drain regions.

FIG. 12 illustrates a top view of the source/drain region and the cavity.

FIG. 13 illustrates a cut-away view following the formation of an inter-level dielectric layer.

FIG. 14 illustrates a cut-away view of the resultant structure following the removal of the sacrificial gates (of FIG. 13) to form cavities that expose the channel regions of the fins.

FIG. 15 illustrates a cut-away view of the resultant structure following the formation of a replacement metal gate (RMG) stack (gate stack).

FIG. 16 illustrates a cut-away view following a selective etching process that removes exposed portions of the inter-level dielectric layer to form cavities that expose the source/drain regions and the cavities in the fin.

FIG. 17 illustrates a cut-away view following the deposition of a conductive material in the cavities (of FIG. 16) to form conductive contacts.

FIGS. 18A-30 illustrates another exemplary method for forming a finFET device with increased source/drain region contact area.

FIG. 18A illustrates a cut-away view along the line B-B (of FIG. 18B) of an arrangement of sacrificial gates arranged on a fin.

FIG. 19 illustrates a cut-away view following a selective anisotropic etching process that removes exposed portions of the fin to form cavities adjacent to the spacers.

FIG. 20 illustrates a cut-away view following the formation of source/drain regions in the cavities (of FIG. 19).

FIG. 21 illustrates a cut-away view following the deposition of a directed self-aligning co-polymer layer that is formed over the source/drain regions.

FIG. 22 illustrates a cut-away view following an annealing process that forms polymer blocks from the directed self-aligning co-polymer layer (of FIG. 21).

FIG. 23 illustrates a cut-away view following a selective etching process that removes the blocks to expose portions of the source/drain region.

FIG. 24 illustrates a cut-away view following an anisotropic etching process that removes exposed portions of the source/drain region to form cavities in the source/drain region.

FIG. 25 illustrates a cut-away view following the removal of the blocks to expose the source/drain regions.

FIG. 26 illustrates a cut-away view following the deposition of an inter-level dielectric layer over portions of the fin, the source/drain region and in the cavities (of FIG. 25).

FIG. 27 illustrates a cut-away view following the removal of the sacrificial gates (of FIG. 26) that forms cavities that expose the channel regions of the fin.

FIG. 28 illustrates a cut-away view following the formation of gate stacks in the cavities (of FIG. 27).

FIG. 29 illustrates a cut-away view following a selective etching process that removes exposed portions of the inter-level dielectric layer to form cavities that expose the source/drain regions and the cavities in the fin.

FIG. 30 illustrates a cut-away view following the deposition of a conductive material in the cavities (of FIG. 29) to form conductive contacts.

DETAILED DESCRIPTION

As pitch scaling continues to decrease, the available surface area for forming low resistance contacts to the source/drain regions of MOSFET devices becomes more limited.

The illustrated exemplary embodiments described herein provide for forming conductive contacts in a fin that have increased surface area for reducing the resistance in the contacts. The embodiments increase the surface area by forming source/drain regions with cavities that are filled with conductive contact material.

FIGS. 1-17 illustrate an exemplary method for forming a finFET with a source/drain region having increased contact area.

Figure 1:
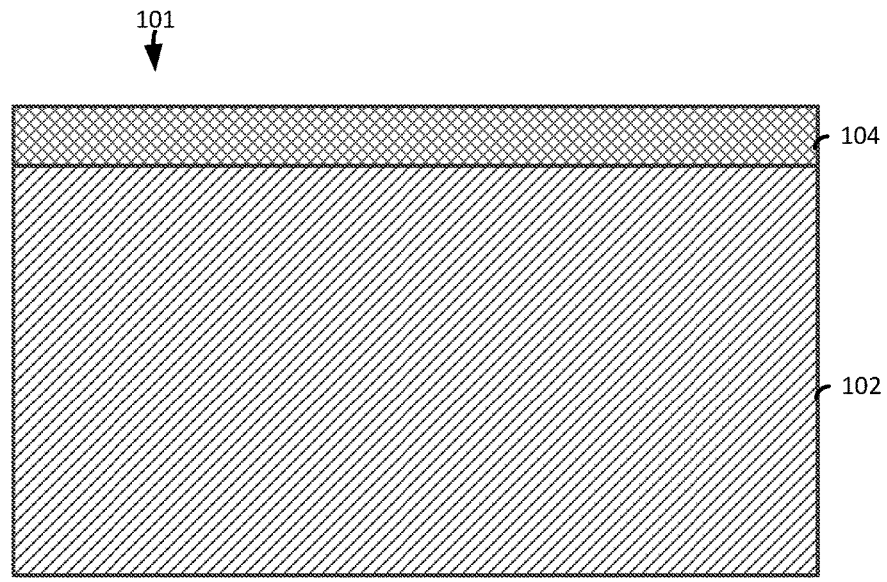

FIG. 1 illustrates a side view of a wafer 101 that includes a bulk semiconductor substrate 102 and a hardmask layer 104 arranged on the semiconductor substrate 102.

The substrate 102 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). The semiconductor substrate 102 can also comprise an organic semiconductor or a layered semiconductor such as, for example, Si/SiGe, a silicon-on-insulator or a SiGe-on-insulator. A portion or entire semiconductor substrate 102 can be amorphous, polycrystalline, or monocrystalline. In addition to the aforementioned types of semiconductor substrates, the semiconductor substrate employed in the present invention can also comprise a hybrid oriented (HOT) semiconductor substrate in which the HOT substrate has surface regions of different crystallographic orientation. The semiconductor substrate 102 can be doped, undoped or contain doped regions and undoped regions therein. The semiconductor substrate can contain regions with strain and regions without strain therein, or contain regions of tensile strain and compressive strain.

A hardmask layer 104 is arranged on the semiconductor substrate 102. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

Though the illustrated exemplary embodiments include a bulk substrate 102, alternate exemplary embodiments can be formed using, for example, a semiconductor-on-insulator wafer arrangement.

Figure 2A:
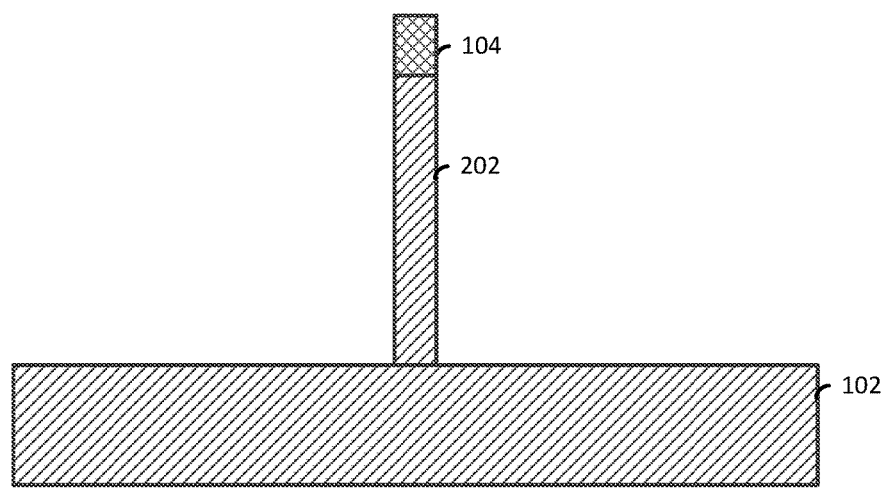
FIG. 2A illustrates a cut-away view along the line A-A (of FIG. 2B) following a lithographic patterning and etching process that removes portions of the hardmask and the substrate to form a fin.
Figure 2B:
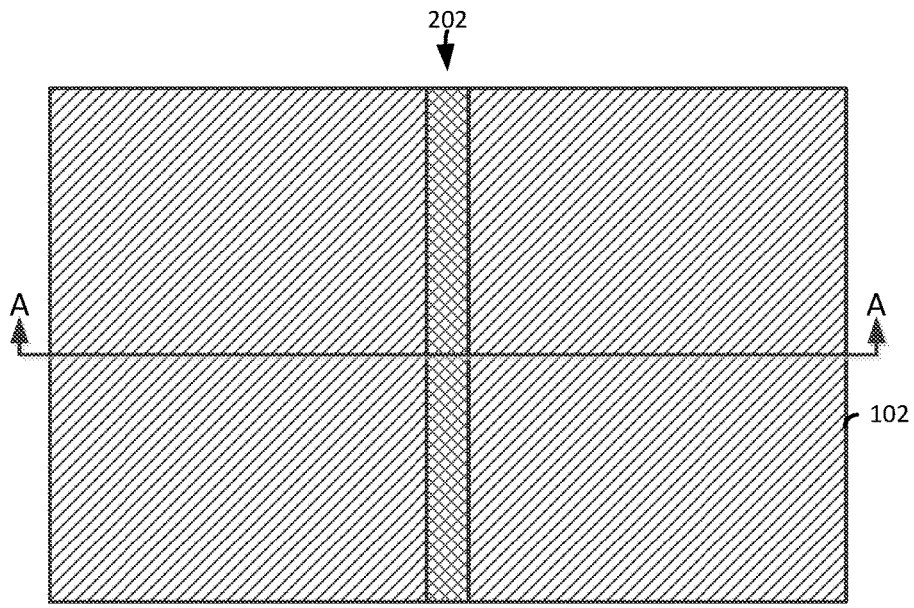
FIG. 2B illustrates a top view of the fin on the substrate.

FIG. 2A illustrates a cut-away view along the line A-A (of FIG. 2B) following a lithographic patterning and etching process that removes portions of the hardmask 104 and the substrate 102 to form a fin 202. The fin 202 can be formed by, for example, a reactive ion etching process. FIG. 2B illustrates a top view of the fin 202 on the substrate 102.

Figure 3:
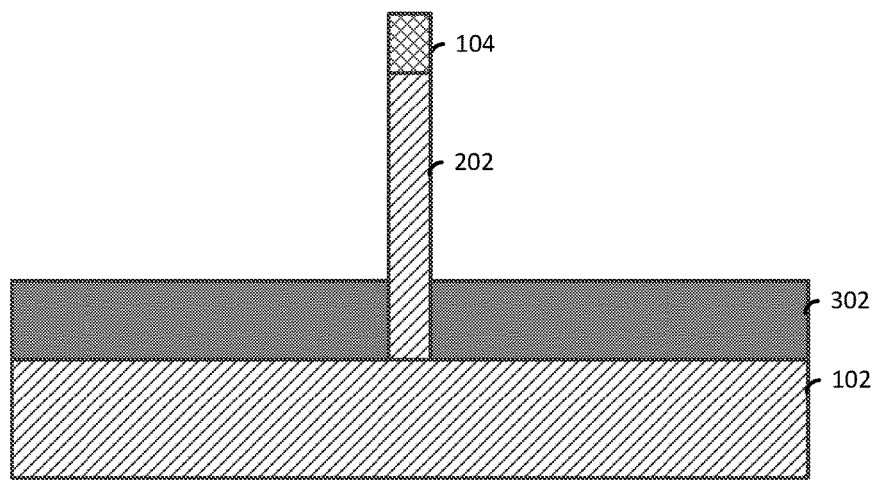

FIG. 3 illustrates a cut-away view following the deposition of a semiconductor trench isolation region 302 adjacent to the fin 202 and on the substrate 102. The STI region 302 can be formed by, any suitable process including, for example, lithography or etching to form trenches, and then filling the trenches with an insulating material, such as silicon dioxide.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 4A:
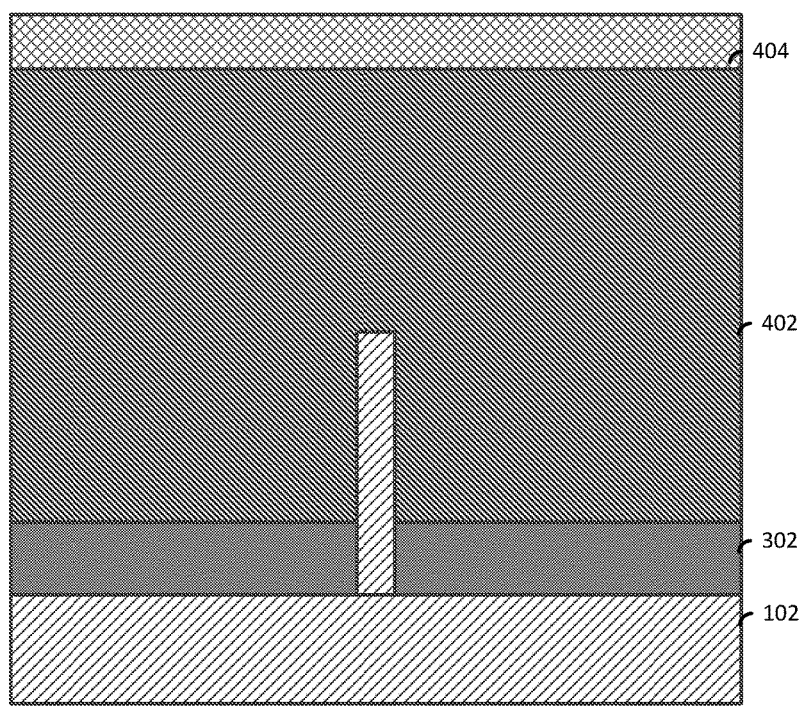
FIG. 4A illustrates a cut-away view along the line A-A (of FIG. 4B) following the formation of sacrificial gates.

FIG. 4A illustrates a cut-away view along the line A-A (of FIG. 4B) following the formation of sacrificial gates 402. The sacrificial gates 402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 402 can further comprise a sacrificial gate dielectric material such as silicon oxide between the nanowires and aSi or polysilicon material.

The layer sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 402 and the sacrificial gate caps 404.

Figure 4B:
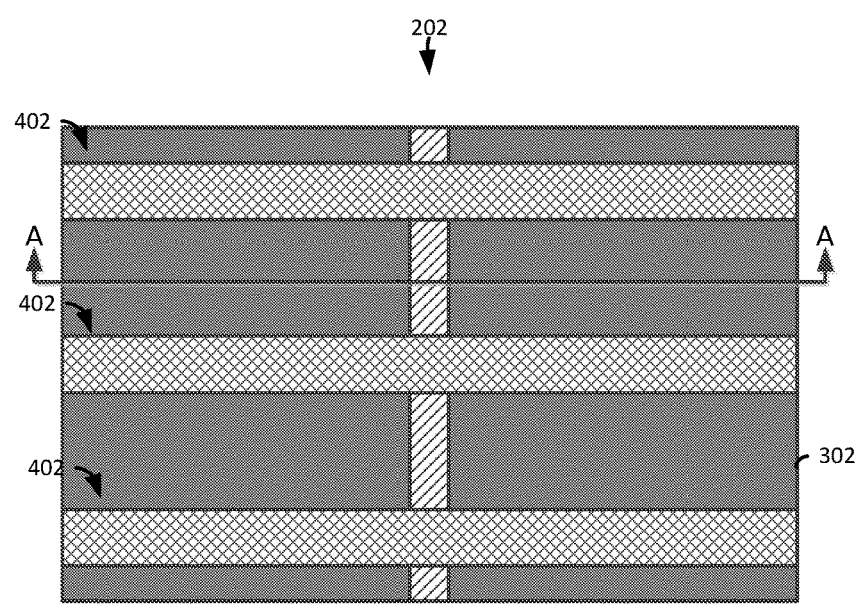
FIG. 4B illustrates a top view of the sacrificial gates arranged on the fin.

FIG. 4B illustrates a top view of the sacrificial gates 402 arranged on the fin 202.

Figure 5A:
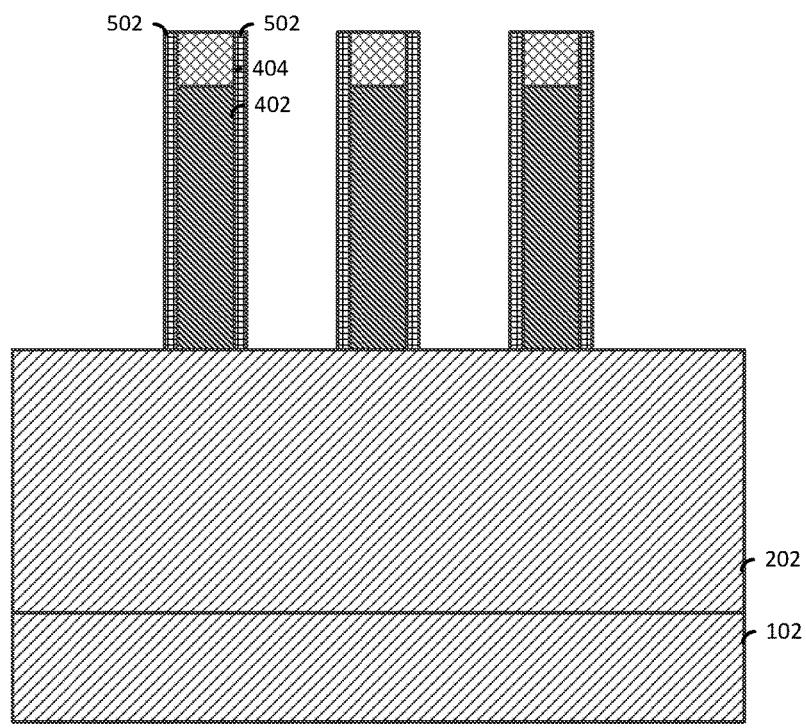
FIG. 5A illustrates a cut-away view along the line B-B (of FIG. 5B) following the formation of spacers adjacent to the sacrificial gates.

FIG. 5A illustrates a cut-away view along the line B-B (of FIG. 5B) following the formation of spacers 502 adjacent to the sacrificial gates 402. The spacers 502 in the illustrated embodiment are formed by depositing a layer of spacer material (not shown) over the exposed portions of the semiconductor trench isolation region 302, the fin 202, and the sacrificial gates 202. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 5B:
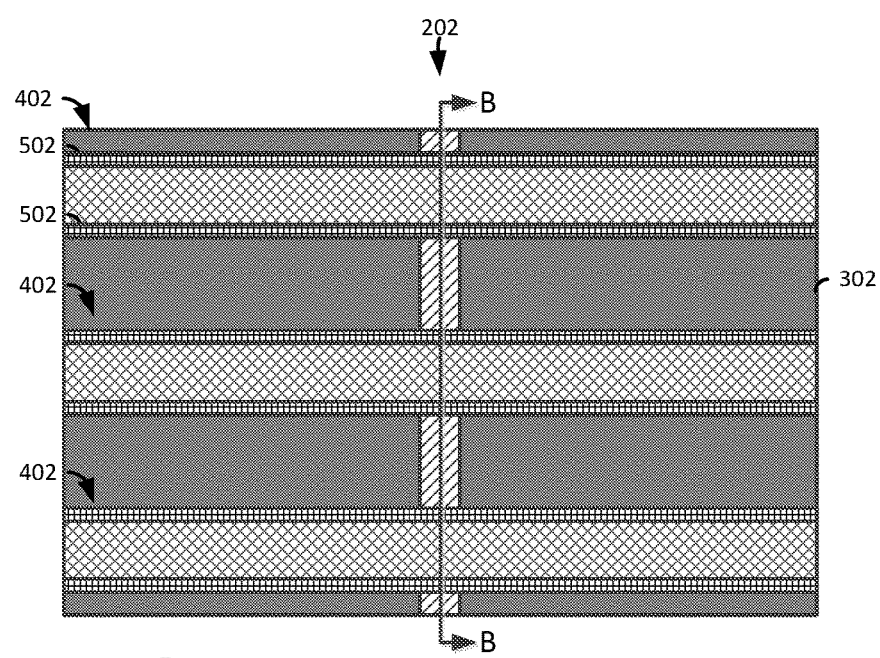
FIG. 5B illustrates a top view of the spacers adjacent to the sacrificial gates.

Following the deposition of the layer of spacer material, a suitable anisotropic etching process such as, for example, a reactive ion etching process is performed to remove portions of the layer of spacer material and form the spacers 502. FIG. 5B illustrates a top view of the spacers 502 arranged adjacent to the sacrificial gates 402.

Figure 6:
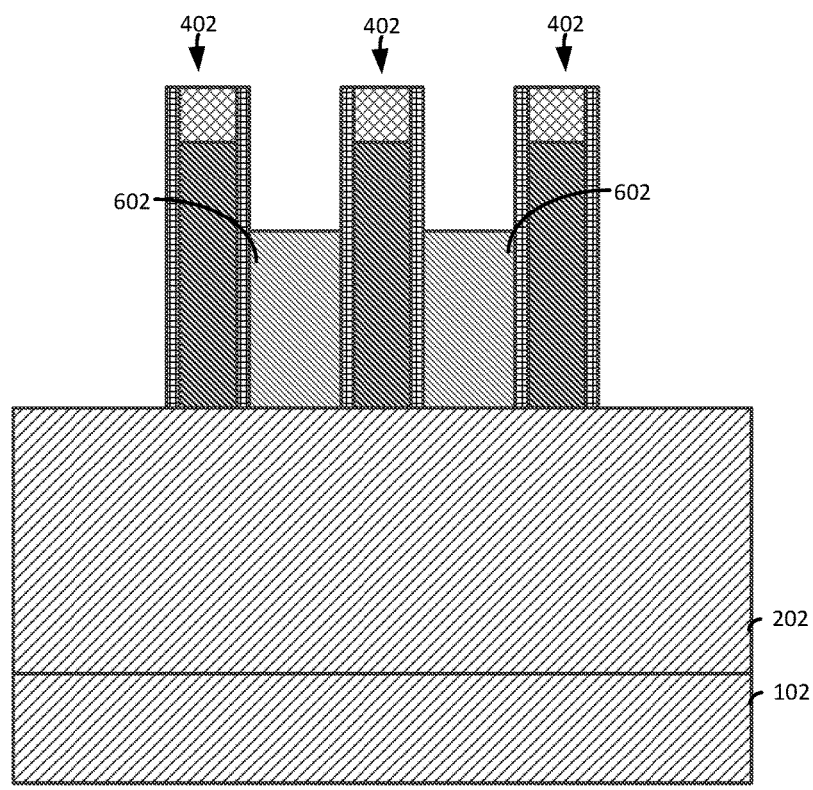

FIG. 6 illustrates a cut-away view following the deposition of a directed self-assembly (DSA) block co-polymer (BCP) material 602 over the fin 202 and between the spacers 502 of the sacrificial gates 402. The deposited co-polymer material 602 can have a thickness with an upper surface that is below the height of the sacrificial gates 402. Block copolymers (BCP) that may be used for directed self-assembly co-polymer material 602 include co-polymers composed of polystyrene (PS) and poly(methyl methacrylate) (PMMA). Alternatively, PS-b-PMMA, PS-b-PVP, PS-b-PDMS, PS-b-PLA and other BCPs can also be used. BCPs may be deposited by, for example, a spin-coating method.

Though the illustrated exemplary embodiment only shows the formation of the co-polymer material 602 over the active regions of a single device for clarity, the co-polymer material 602 may be formed adjacent to one or more of the sacrificial gates 402 in alternate exemplary methods.

Figure 7:
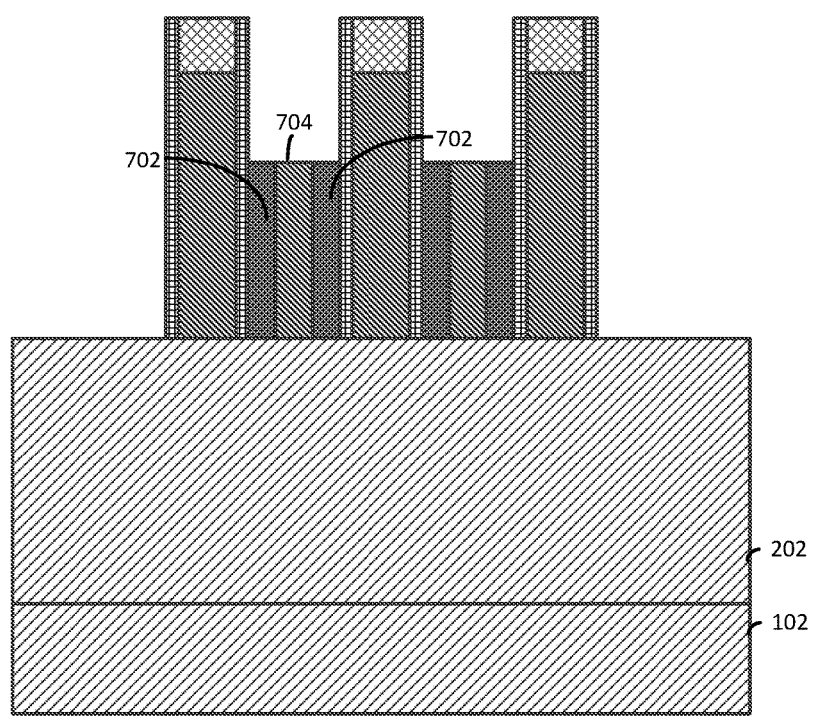

FIG. 7 illustrates a cut-away view following an annealing process that results in phase separation of the co-polymer material 602 that results in the formation of blocks 702 and 704. Phase separation of BCPs is a material-dependent behavior that generally occurs above a glass transition temperature (Tg) and below order-disorder temperature (ODT). For example, if PS-b-PMMA is used, annealing temperature may range from approximately 180 C to 300 C under ambient or nitrogen environment. Tg, ODT, as well as thermal degradation temperature varies with BCP systems.

Figure 8:
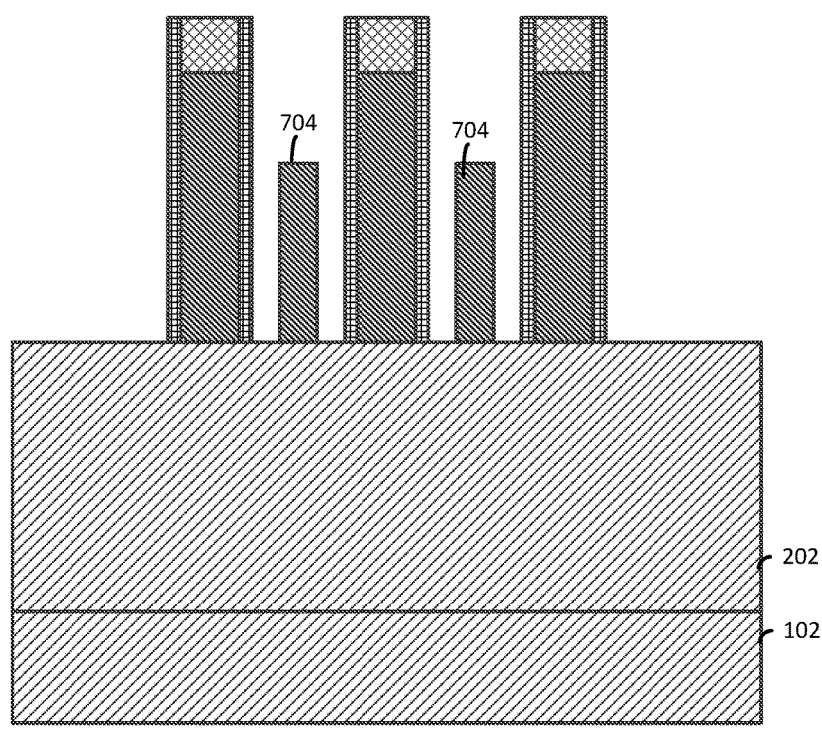

FIG. 8 illustrates a cut-away view following a selective etching process that removes the blocks 702 (of FIG. 7) and exposes portions of the fin 202. Selective etching of one of the blocks may be achieved, for example, with a reactive ion etch (RIE) or a UV exposure process followed by a selective solvent rinse such as acetic acid or IPA. For a RIE process, selectivity between the blocks and pattern transfer fidelity varies with etch chemistry and plasma conditions.

Figure 9:
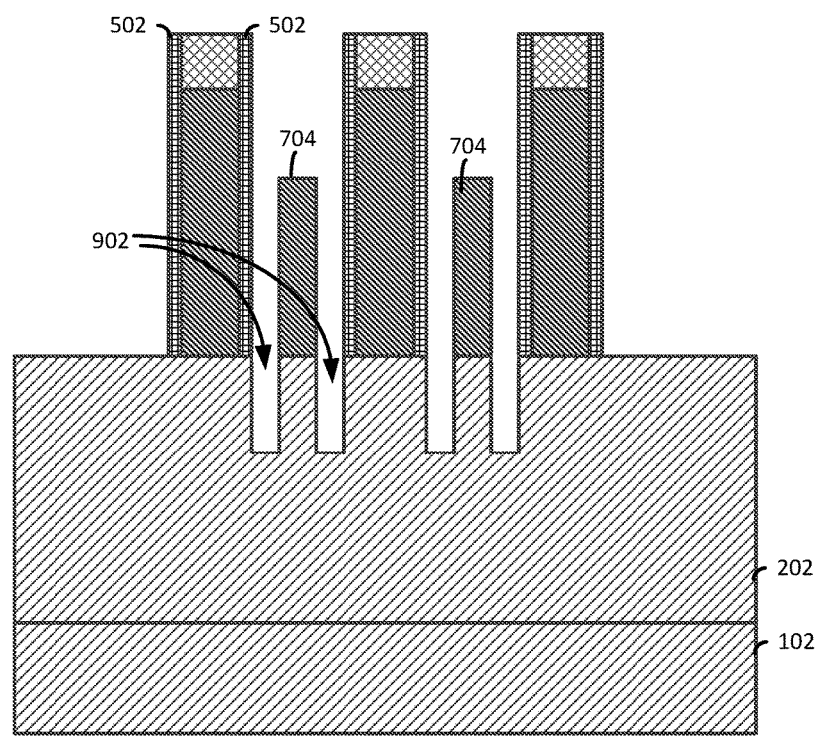

FIG. 9 illustrates a cut-away view following a selective anisotropic etching process that removes exposed portions of the fin 202 to form cavities (first cavities and second cavities) 902 adjacent to the spacers 502. The etching process can include any suitable etching process such as, for example, reactive ion etching.

Figure 10:
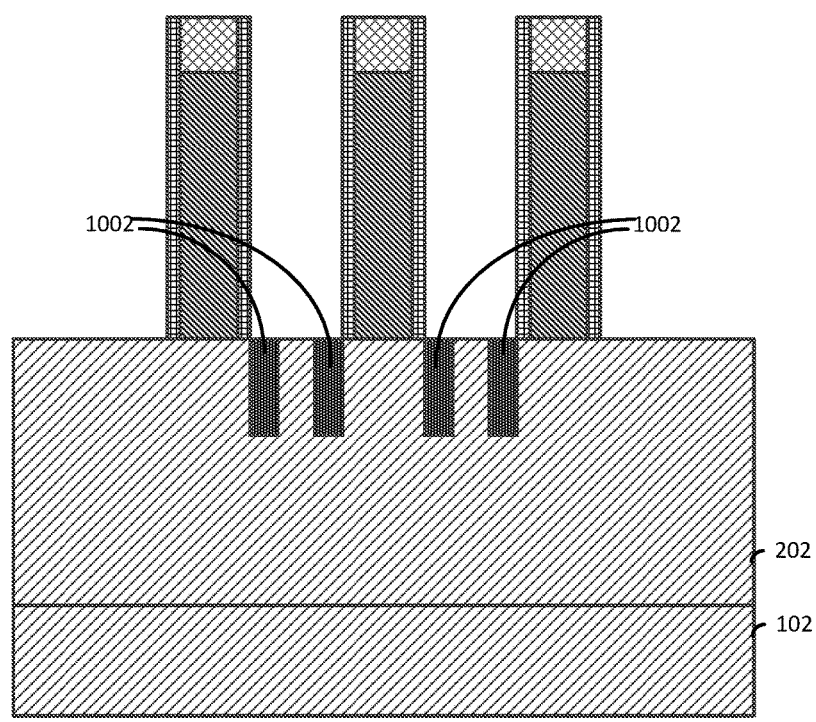

FIG. 10 illustrates a cut-away view following the removal of the block 704 (of FIG. 9) and the formation of source/drain regions 1002 in the cavities 902 (of FIG. 9).

The source/drain regions 1002 are formed by an epitaxial growth process that deposits a crystalline overlayer of semiconductor material onto the exposed crystalline seed material of the exposed fin 202 in the cavities 902 to form the source/drain regions 1002.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from 1×1019 cm-3 to 2×1021 cm-3, or preferably between 2×1020 cm-3 to 1×1021 cm-3.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 11:
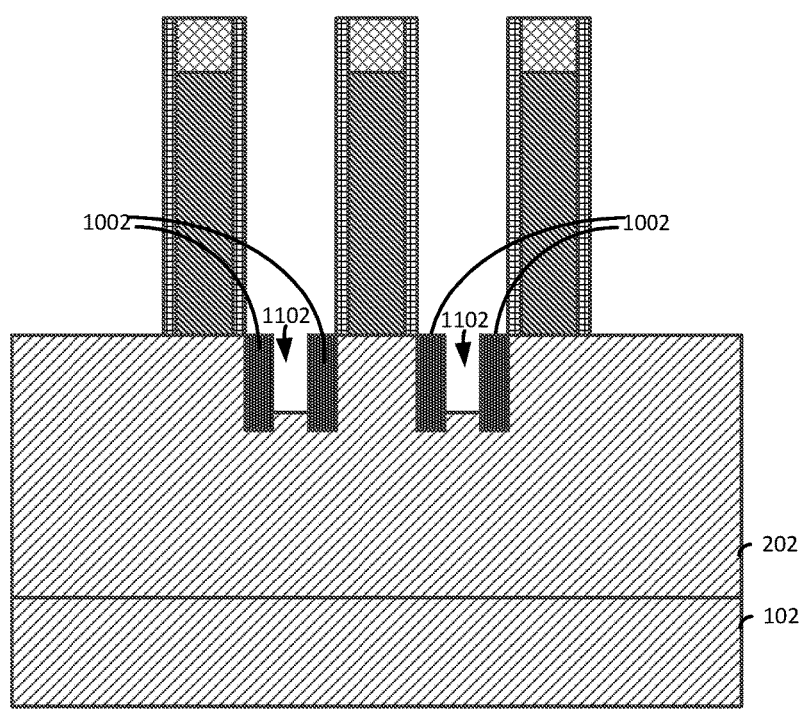

FIG. 11 illustrates a cut-away view following a selective etching process that removes material from the fin 202 between the source/drain regions 1002 to form a cavity 1102 between the source/drain regions 1002. The cavity 1102 can be formed by, for example, a reactive ion etching process.

Figure 12:
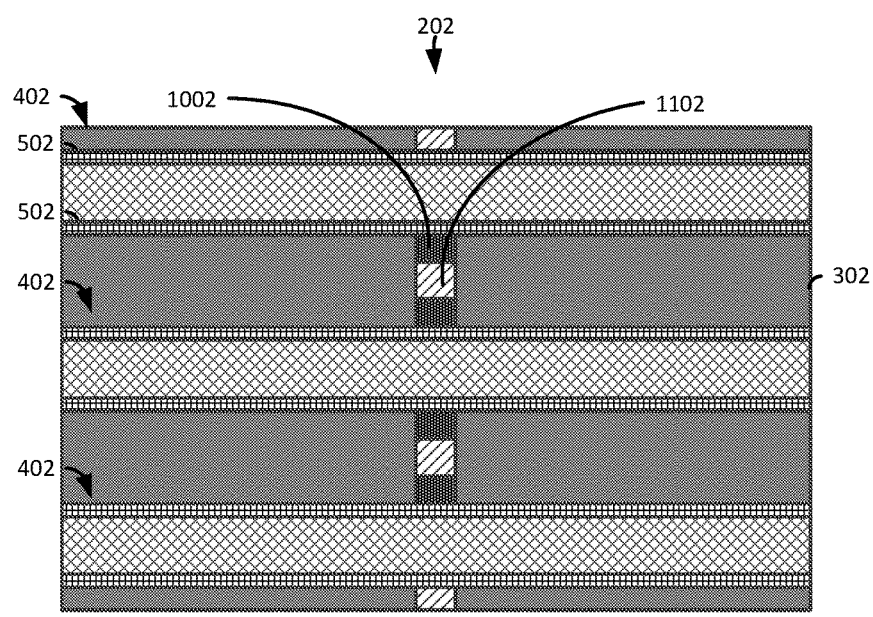

FIG. 12 illustrates a top view of the source/drain region 1002 and the cavity 1102.

Figure 13:
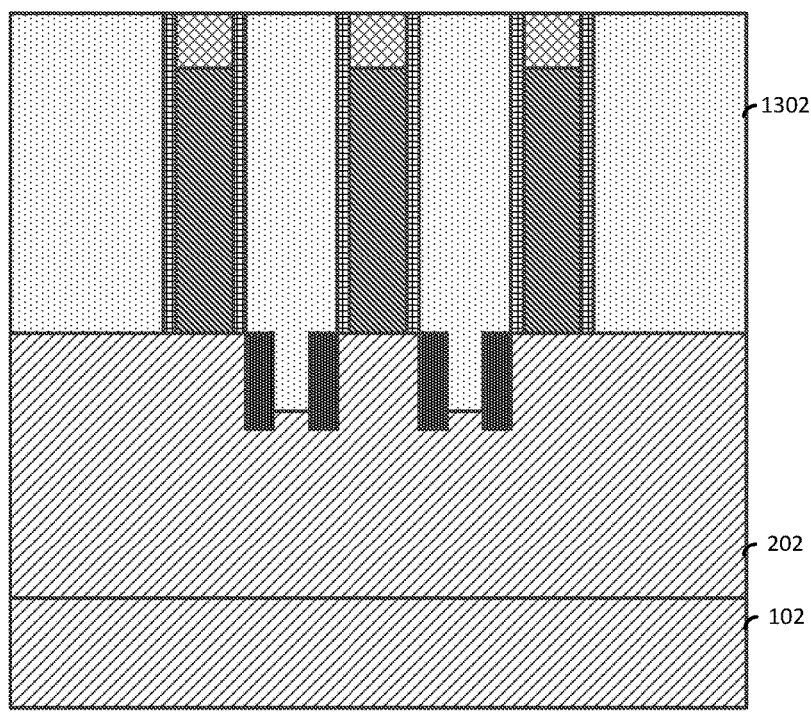

FIG. 13 illustrates a cut-away view following the formation of an inter-level dielectric layer 1302. The inter-level dielectric layer 1302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1302 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1302, a planarization process such as, for example, chemical mechanical polishing is performed.

Figure 14:
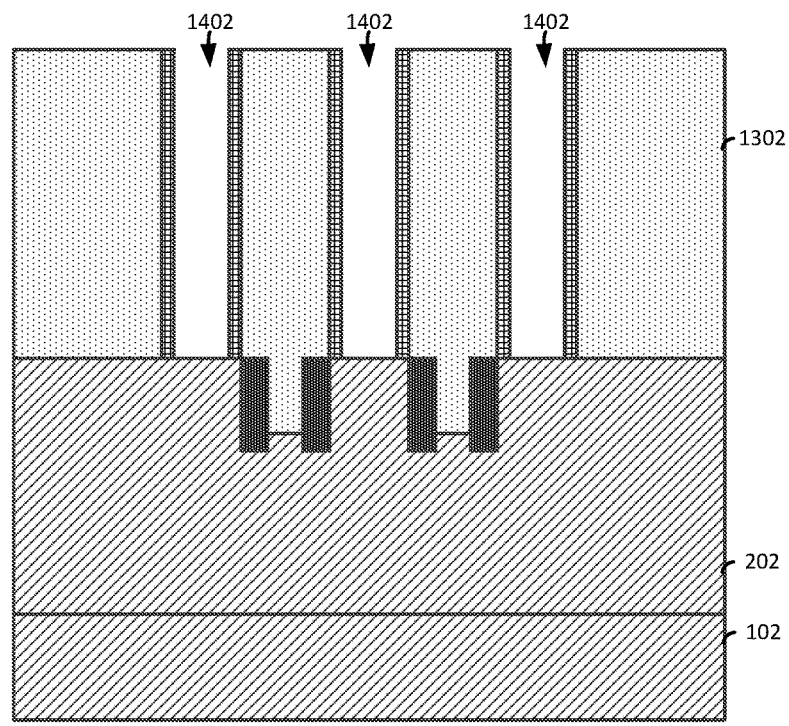

FIG. 14 illustrates a cut-away view of the resultant structure following the removal of the sacrificial gates 402 (of FIG. 13) to form cavities 1402 that expose the channel regions of the fins 202. The sacrificial gates 402 can be removed by performing a dry etch process, for example, RIE, followed by a wet etch process. The wet etch process is selective to (will not substantially etch) the spacers 502 and the inter-level dielectric material. The chemical etch process can include, but is not limited to, hot ammonia or tetramethylammonium hydroxide (TMAH).

Figure 15:
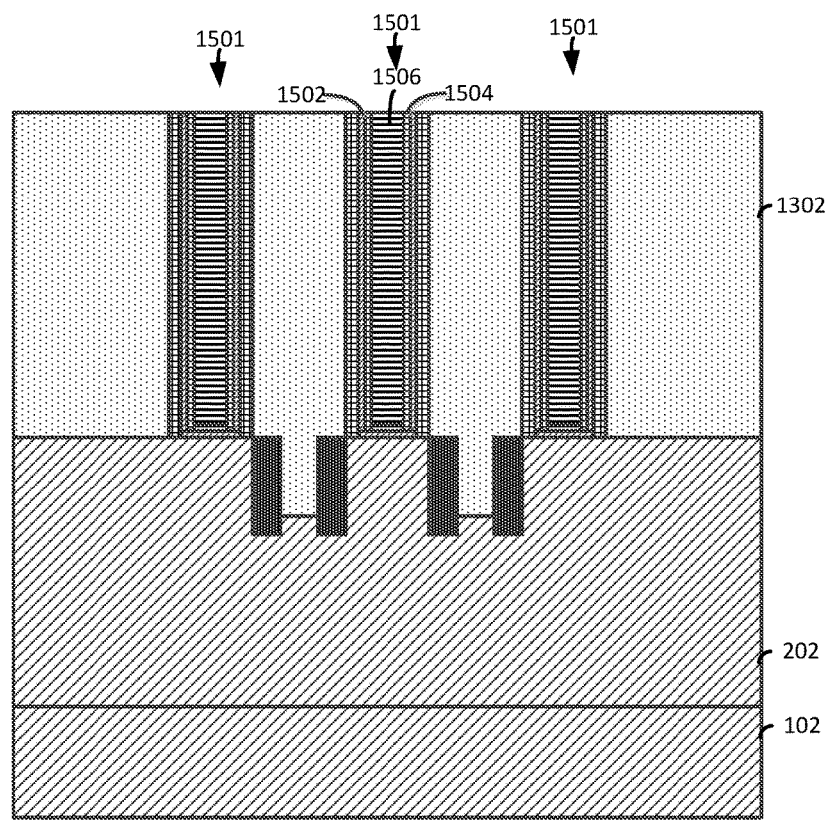

FIG. 15 illustrates a cut-away view of the resultant structure following the formation of a replacement metal gate stack (gate stack) 1501. The gate stack 1501 include high-k metal gates formed, for example, by filling the cavity 1402 (of FIG. 14) with one or more gate dielectric 1502 materials, one or more workfunction metals 1504, and one or more metal gate conductor 1506 materials. The gate dielectric 1502 material(s) can be a dielectric material having a dielectric constant greater than 3.9, 7.0, or 10.0. Non-limiting examples of suitable materials for the dielectric 1502 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 1502 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 1504 can be disposed over the gate dielectric 1502 material. The type of work function metal(s) 1504 depends on the type of transistor and can differ between the nFET and pFET devices. Non-limiting examples of suitable work function metals 1504 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 1506 material(s) is deposited over the gate dielectric 1502 materials and work function metal(s) 1504 to form the gate stack 1501. Non-limiting examples of suitable conductive metals include aluminum (Al), platinum (Pt), gold (Au), tungsten (W), titanium (Ti), or any combination thereof. The gate conductor 1506 material(s) can be deposited by a suitable deposition process, for example, CVD, PECVD, PVD, plating, thermal or e-beam evaporation, and sputtering.

Following the deposition of the gate dielectric 1502 materials, the work function metal(s) 1504, and the gate conductor 1506 material(s), planarization process, for example, chemical mechanical planarization (CMP), is performed to remove the overburden of the deposited gate materials and form the gate stack 1501.

Figure 16:
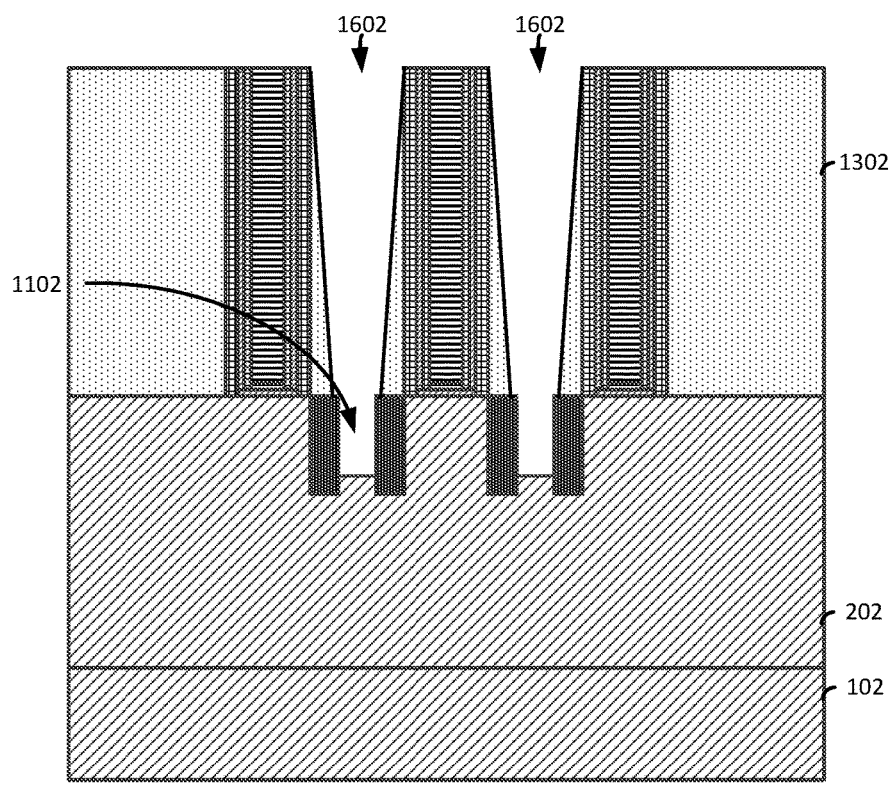

FIG. 16 illustrates a cut-away view following a selective etching process that removes exposed portions of the inter-level dielectric layer 1302 to form cavities 1602 that expose the source/drain regions 1002 and the cavities 1102 in the fin 202. In some embodiments, a silicide (not shown) can be formed on exposed portions of the source/drain regions 1002.

Figure 17:
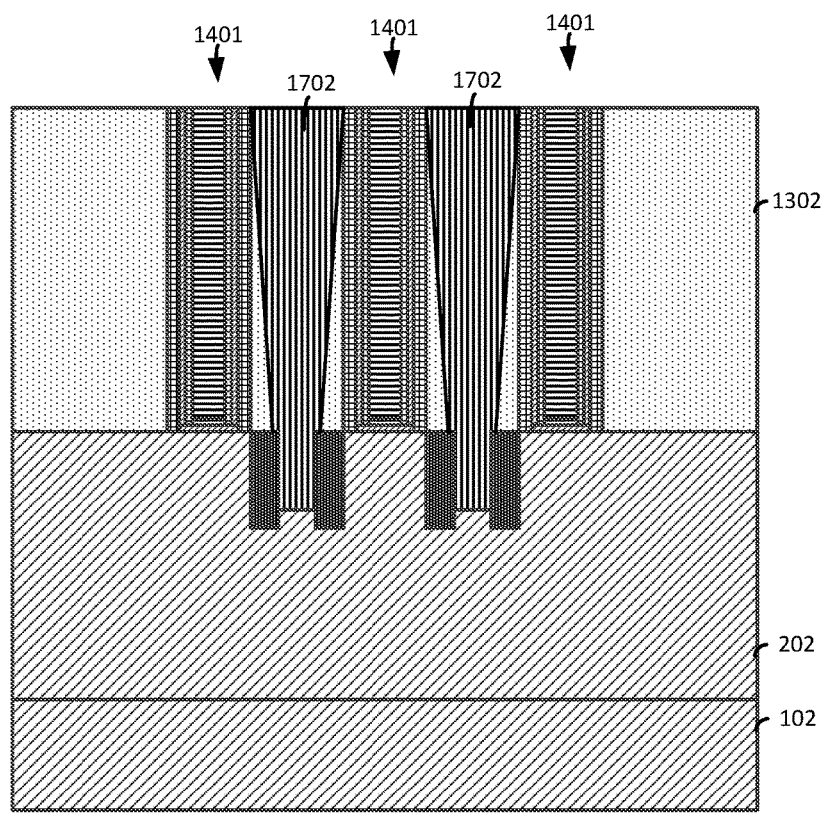

FIG. 17 illustrates a cut-away view following the deposition of a conductive material in the cavities 1602 (of FIG. 16) to form conductive contacts 1602. In some embodiments, a liner layer (not shown) can be deposited prior to depositing the conductive material. The conductive material can include, for example, silver, gold, aluminum, or copper.

The conductive contacts 1602 have a relatively large surface area in the interface between the conductive contacts 1602 and the source/drain regions 1002 due to the cavities 1102 formed between the source/drain regions 1002, which reduces the contact resistance in the device.

FIGS. 18A-30 illustrate another exemplary method for forming a finFET device with increased source/drain region contact area.

Figure 18A:
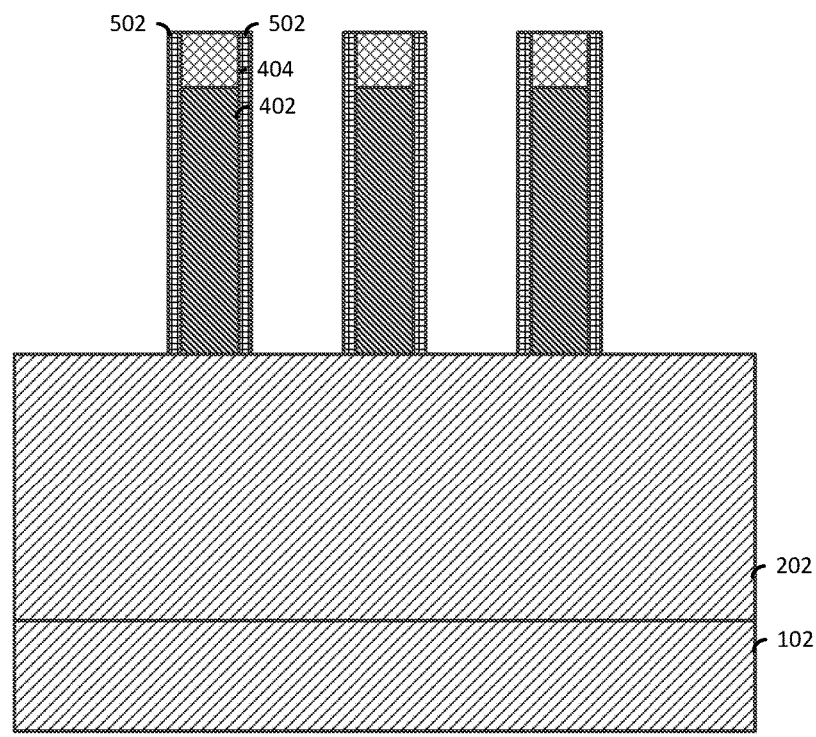
Figure 18B:
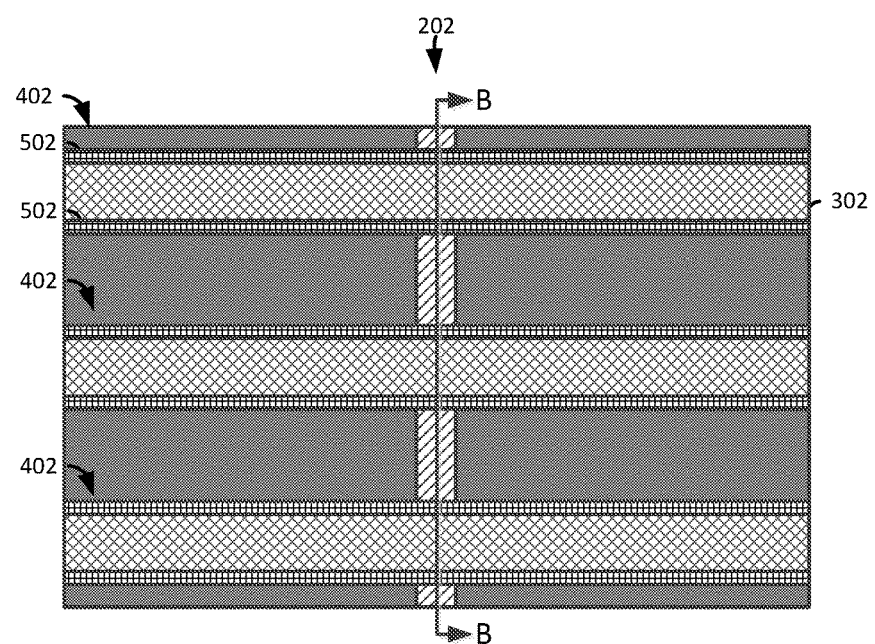
FIG. 18B illustrates a top view of the sacrificial gates and the spacers arranged over the fin.

FIG. 18A illustrates a cut-away view along the line B-B (of FIG. 18B) of an arrangement of sacrificial gates 402 arranged on a fin 202. The illustrated embodiment of FIG. 18A is similar to the illustrated embodiment of FIG. 5A described above. FIG. 18B illustrates a top view of the sacrificial gates 402 and the spacers 502 arranged over the fin 202.

Figure 19:
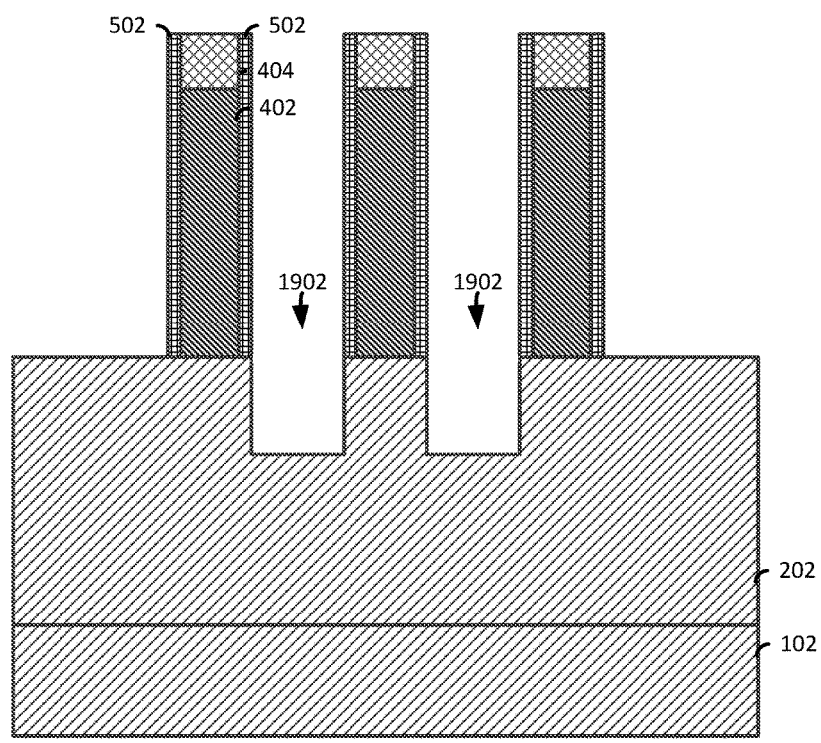

FIG. 19 illustrates a cut-away view following a selective anisotropic etching process that removes exposed portions of the fin 202 to form cavities 1902 adjacent to the spacers 502. The etching process can include, for example, a photolithographic patterning and etching process such as reactive ion etching.

Figure 20:
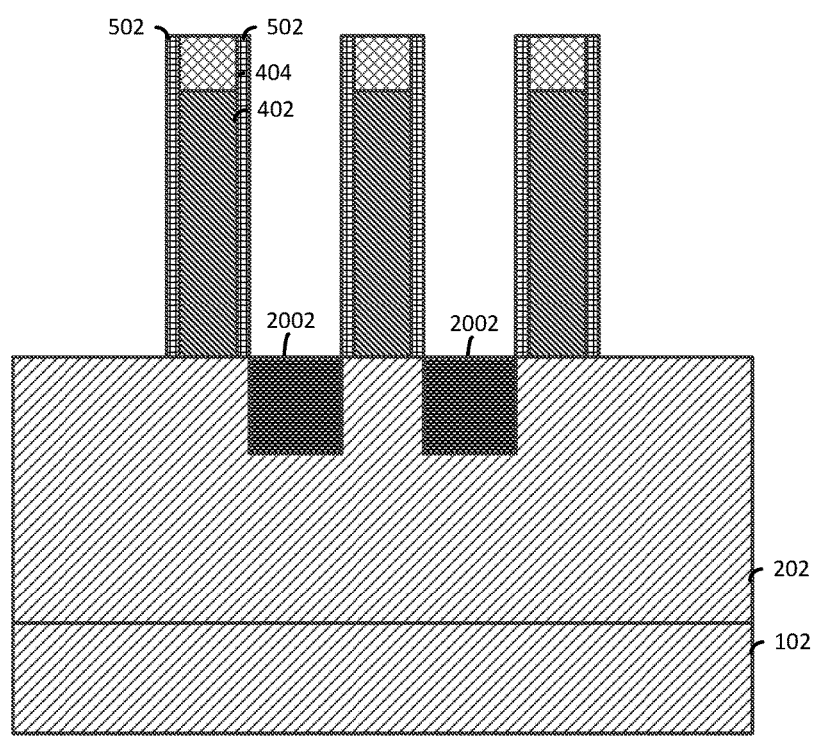

FIG. 20 illustrates a cut-away view following the formation of source/drain regions 2002 in the cavities 1902 (of FIG. 19). The source/drain regions 2002 are formed using an epitaxial growth process similar to the process used to form the source/drain regions 1002 (of FIG. 10) described above.

Figure 21:
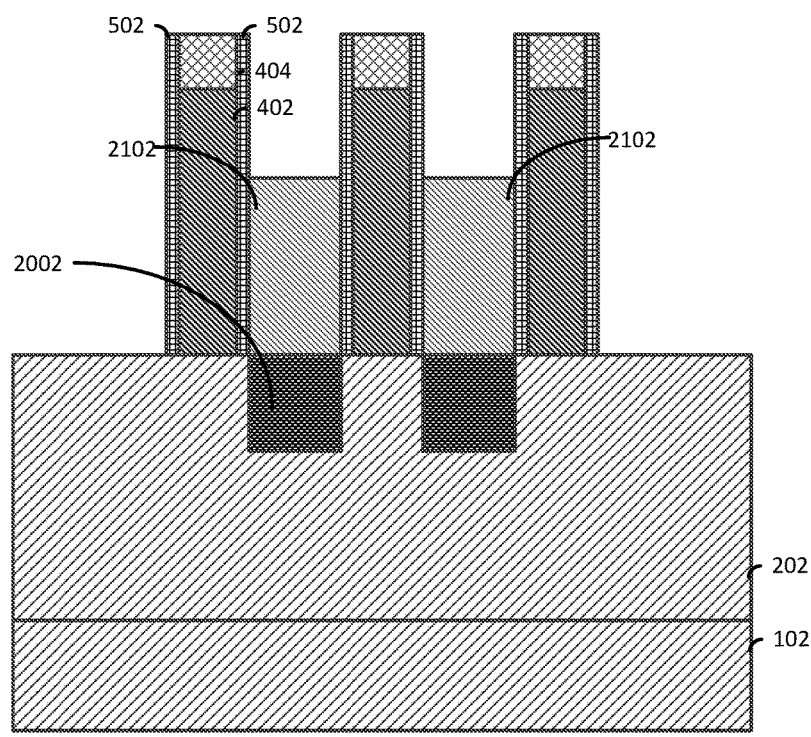

FIG. 21 illustrates a cut-away view following the deposition of a directed self-aligning co-polymer layer 2102 that are formed over the source/drain regions 2002. The directed self-aligning co-polymer layer 2102 is deposited using a similar process as described above for the directed self-aligning co-polymer layer 602 (of FIG. 6) described above.

Figure 22:
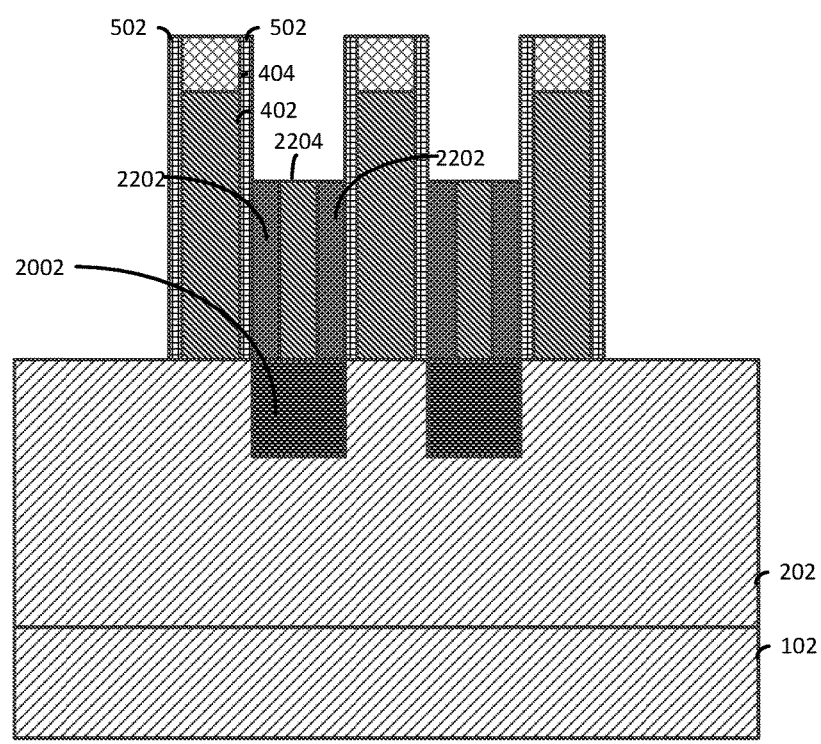

FIG. 22 illustrates a cut-away view following an annealing process that forms polymer blocks 2202 and 2204 from the directed self-aligning co-polymer layer 2102 (of FIG. 21).

Figure 23:
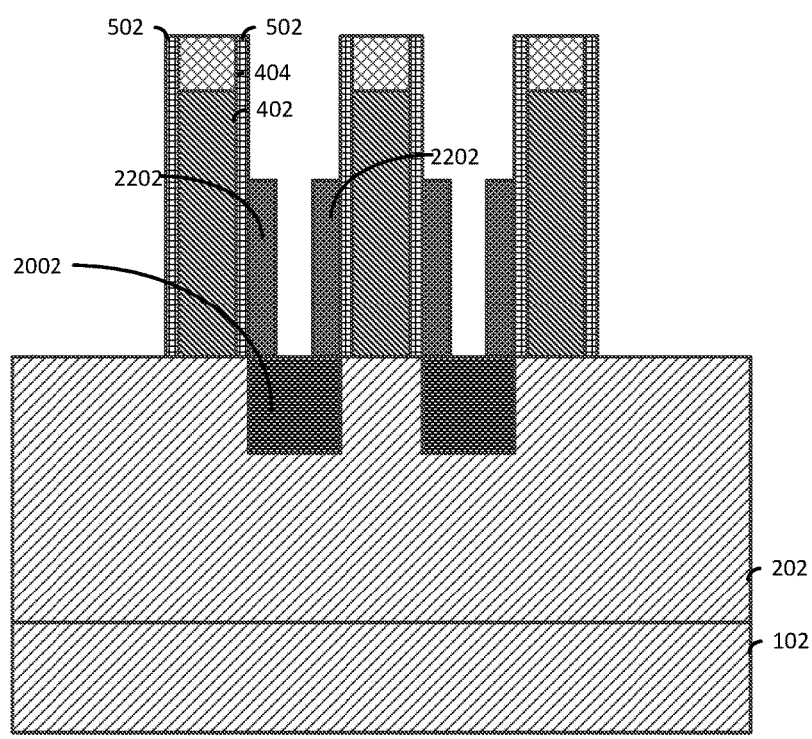

FIG. 23 illustrates a cut-away view following a selective etching process that removes the blocks 2202 to expose portions of the source/drain region 2002.

Figure 24:
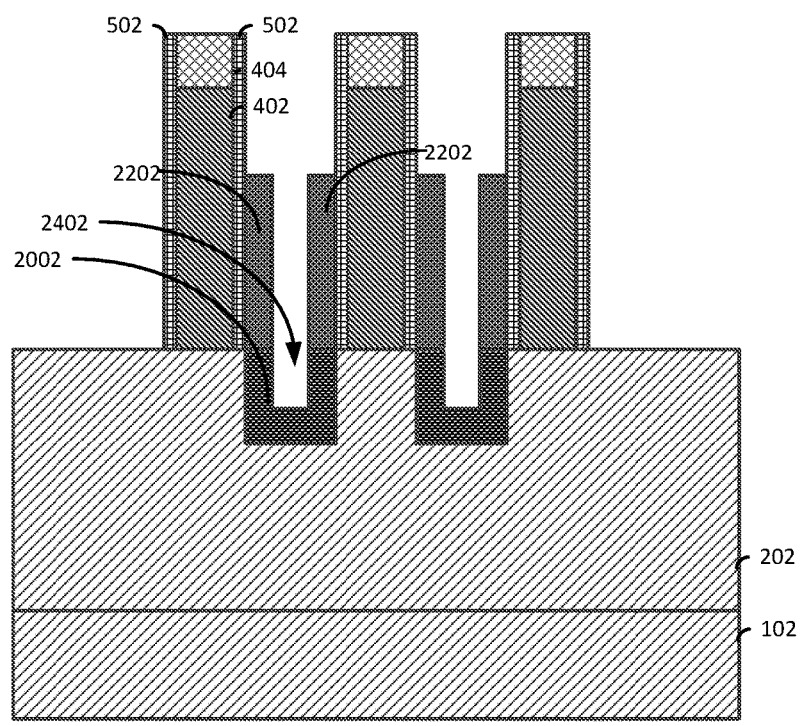

FIG. 24 illustrates a cut-away view following an anisotropic etching process that removes exposed portions of the source/drain region 2002 to form cavities 2402 in the source/drain region 2002. The etching process can include, for example, reactive ion etching. It may be beneficial to maintain a portion of epitaxial source/drain at the bottom of the recess cavities 2402, to provide reduced contact resistance.

Figure 25:
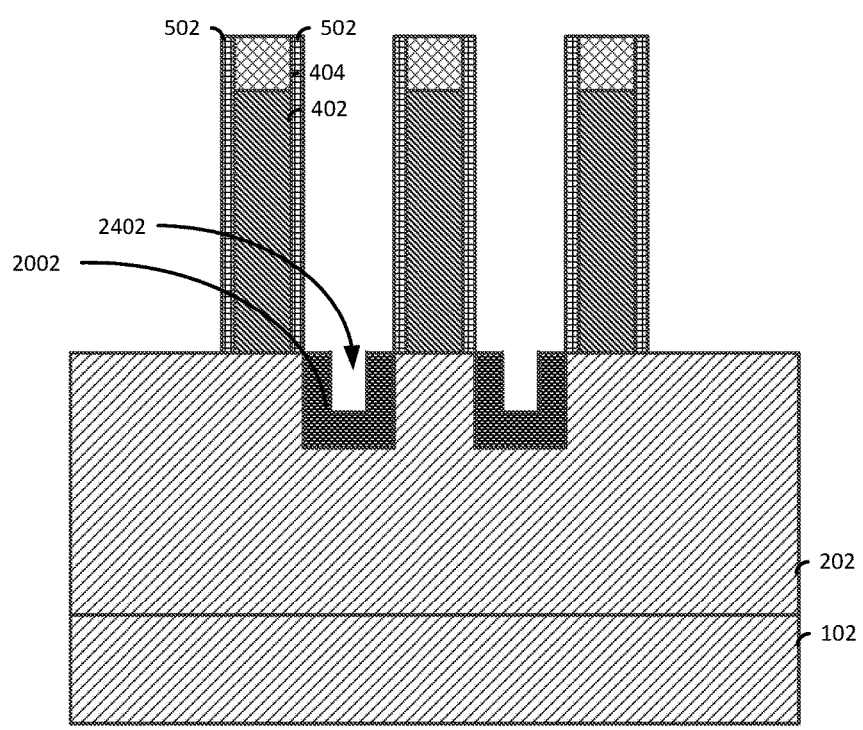

FIG. 25 illustrates a cut-away view following the removal of the blocks 2204 to expose the source/drain regions 2202.

Figure 26:
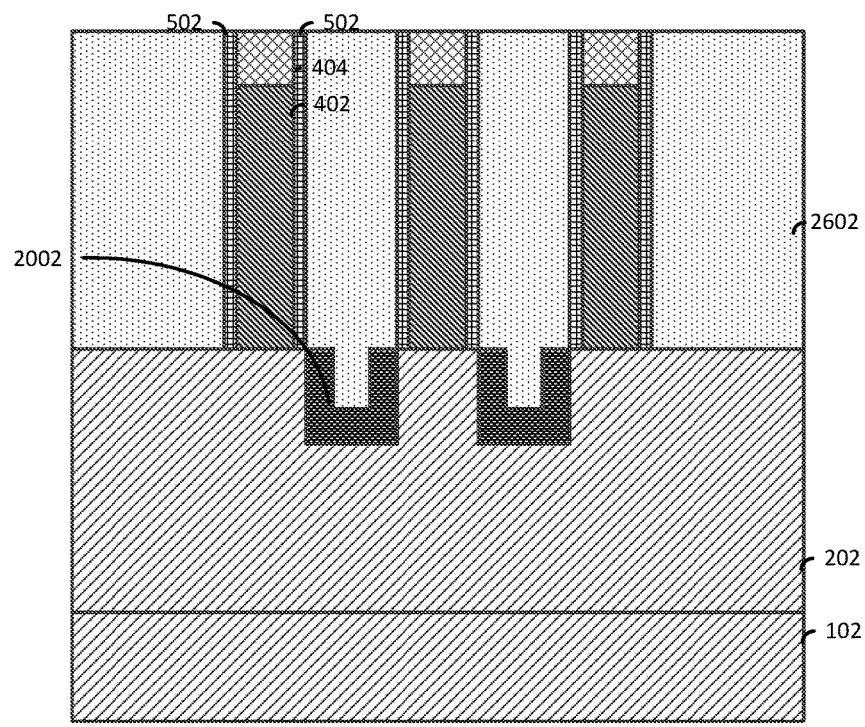
Figure 27:
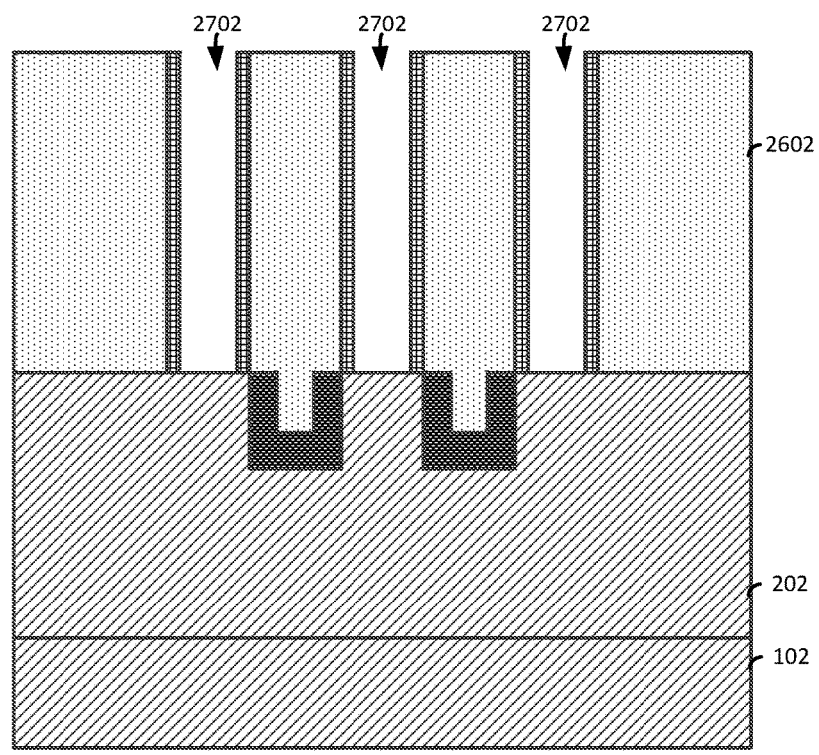

FIG. 26 illustrates a cut-away view following the deposition of an inter-level dielectric layer 2602 over portions of the fin 202, the source/drain region 2002 and in the cavities 2402 (of FIG. 25) using a similar process as described above to form the inter-level dielectric layer FIG. 27 illustrates a cut-away view following the removal of the sacrificial gates 402 (of FIG. 26) that forms cavities 2702 that expose the channel regions of the fin 202.

Figure 28:
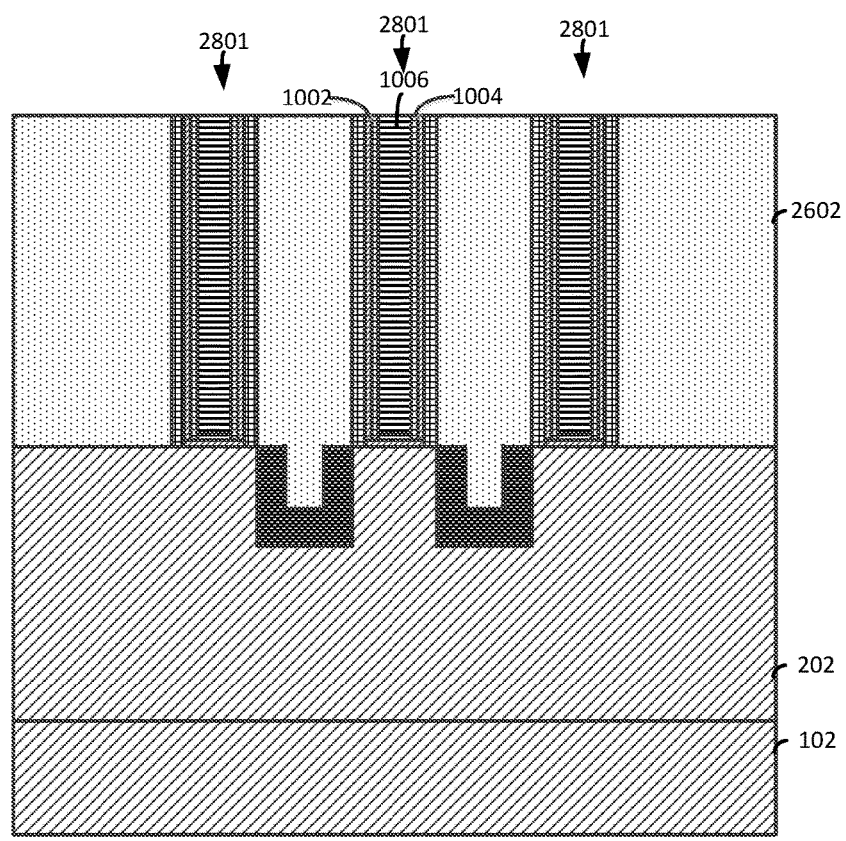

FIG. 28 illustrates a cut-away view following the formation of gate stacks 2801 in the cavities 2702 (of FIG. 27). The gate stacks 2801 are similar to the gate stacks 1501 (of FIG. 15) described above. The gate stacks 1501 include gate dielectric 1502 materials, work function metal(s) 1504, and gate conductor 1506 material(s) described above.

Figure 29:
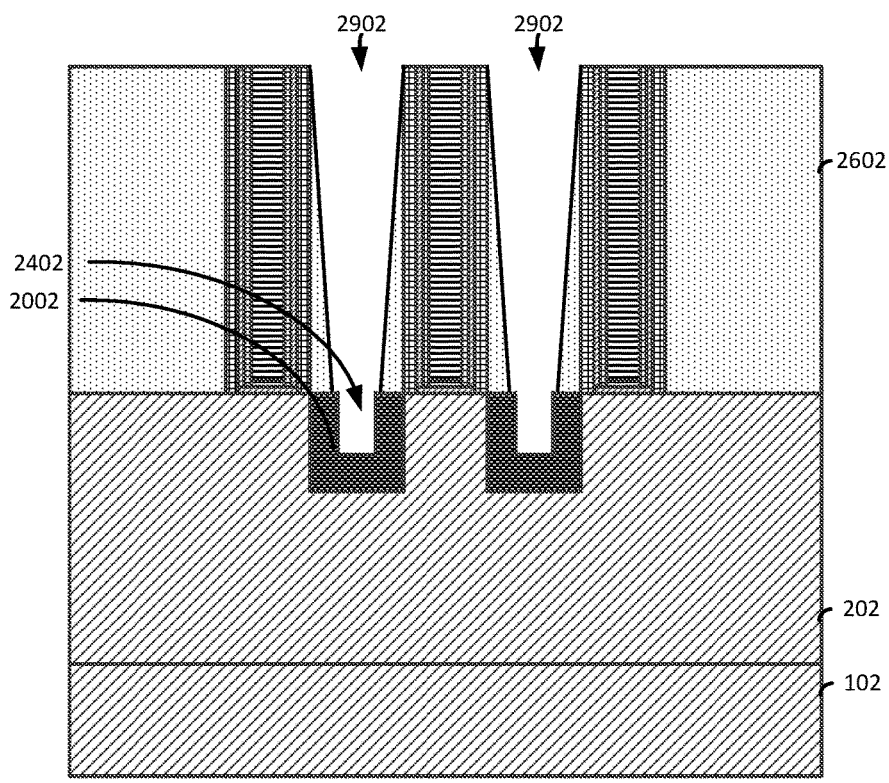

FIG. 29 illustrates a cut-away view following a selective etching process that removes exposed portions of the inter-level dielectric layer 2602 to form cavities 2902 that expose the source/drain regions 2002 and the cavities 2402 in the fin 202. In some embodiments, a silicide (not shown) can be formed on exposed portions of the source/drain regions 2002.

Figure 30:
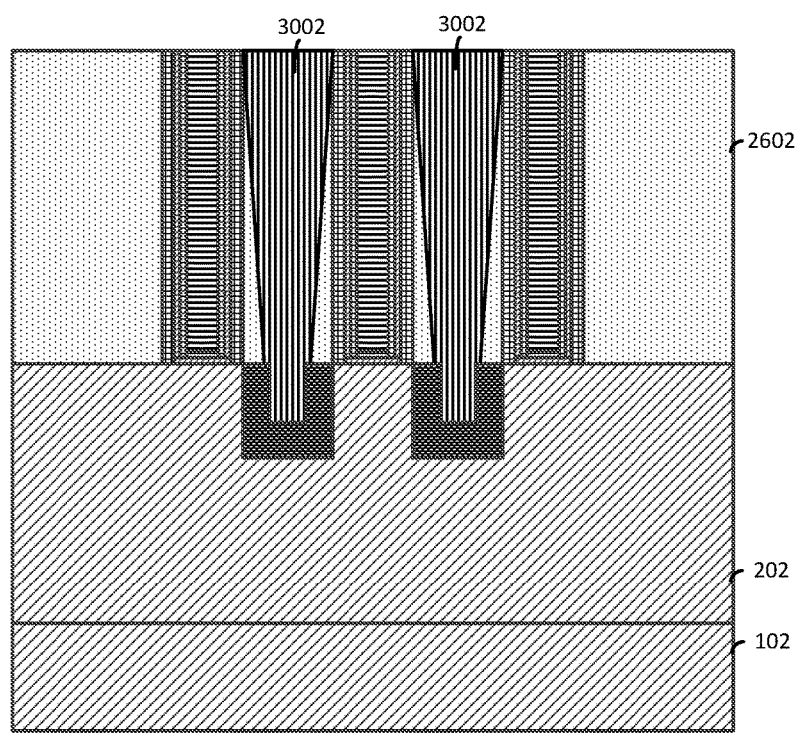

FIG. 30 illustrates a cut-away view following the deposition of a conductive material in the cavities 2902 (of FIG. 29) to form conductive contacts 3002. In some embodiments, a liner layer (not shown) can be deposited prior to depositing the conductive material. The conductive material can include, for example, silver, gold, aluminum, or copper.

The conductive contacts 3002 have a relatively large surface area in the interface between the conductive contacts 3002 and the source/drain regions 2002 due to the cavities 2402 formed in the source/drain regions 2002, which reduces the contact resistance in the device.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device, the method comprising:
   forming a semiconductor fin on a substrate;
   forming a sacrificial gate on a channel region of the fin;
   forming a co-polymer layer on the fin adjacent to the sacrificial gate;
   annealing to form a first block, a second block, and a third block from the co-polymer layer on the fin, the second block arranged between the first block and the third block;
   removing the first block and the third block to expose portions of the fin;
   removing exposed portions of the fin to form a first cavity and a second cavity in the fin;
   removing the second block to expose a portion of the fin;
   growing a source/drain region in the first cavity and the second cavity;
   removing a region of the fin arranged between the source/drain region in the first cavity and the second cavity to form a third cavity;
   depositing an insulator layer over the source/drain region and the third cavity;
   removing the sacrificial gate;
   forming a gate stack over a channel region of the fin;
   removing portions of the insulator layer to form a fourth cavity that exposes the source/drain region and the third cavity; and
   filling the fourth cavity and the exposed third cavity with a conductive contact material.

2. The method of claim 1, further comprising forming a spacer adjacent to the sacrificial gate prior to depositing the co-polymer layer.

3. The method of claim 1, wherein the co-polymer layer included a directed self-assembly co-polymer material.

4. The method of claim 1, further comprising depositing a liner layer in the fourth cavity prior to depositing the conductive contact material.

5. The method of claim 1, wherein forming the semiconductor fin on the substrate comprises:
   forming a hardmask on the substrate; and
   patterning and removing portions of the hardmask and the substrate to form the fin.

6. The method of claim 1, further comprising depositing an insulator layer on the substrate adjacent to the fin prior to forming the sacrificial gate.

7. The method of claim 1, further comprising performing a planarization process following the filling the fourth cavity and the exposed third cavity with the conductive contact material.

8. The method of claim 1, wherein the substrate includes a semiconductor material.

9. The method of claim 1, wherein the first block and the third block are removed using a selective etching process.

10. A method for fabricating a semiconductor device, the method comprising:
    forming a semiconductor fin on a substrate;
    forming a sacrificial gate on a channel region of the fin;
    removing portions of the fin to form a first cavity adjacent to the sacrificial gate;
    growing a source/drain region in the first cavity;
    forming a co-polymer layer on the source/drain region adjacent to the sacrificial gate;
    annealing to form a first block, a second block, and a third block from the co-polymer layer on the source/drain region, the second block arranged between the first block and the third block;
    removing the second block expose a portions of the source/drain region;
    removing exposed portions of the source/drain region to form a second cavity in the source/drain region;
    depositing an insulator layer over the source/drain region and the second cavity;
    removing the sacrificial gate;
    forming a gate stack over a channel region of the fin;
    removing portions of the insulator layer to form a third cavity that exposes the source/drain region and the second cavity; and
    filling the third cavity and the exposed second cavity with a conductive contact material.

11. The method of claim 10, further comprising forming a spacer adjacent to the sacrificial gate prior to depositing the co-polymer layer.

12. The method of claim 10, wherein the co-polymer layer included a directed self-assembly co-polymer material.

13. The method of claim 10, further comprising depositing a liner layer in the third cavity prior to depositing the conductive contact material.

14. The method of claim 10, wherein forming the semiconductor fin on the substrate comprises:
    forming a hardmask on the substrate; and
    patterning and removing portions of the hardmask and the substrate to form the fin.

15. The method of claim 10, further comprising depositing an insulator layer on the substrate adjacent to the fin prior to forming the sacrificial gate.

16. The method of claim 10, further comprising performing a planarization process following the filling the fourth cavity and the exposed third cavity with the conductive contact material.

17. The method of claim 10, wherein the substrate includes a semiconductor material.

18. The method of claim 10, wherein the first block and the third block are removed using a selective etching process.

\* \* \* \* \*